(12) United States Patent
Sasaki et al.

(10) Patent No.: US 6,444,099 B1
(45) Date of Patent: Sep. 3, 2002

(54) IONIZING SPUTTERING METHOD

(75) Inventors: Masao Sasaki; Kiyohiko Funato, both of Tokyo (JP)

(73) Assignee: Anelva Corporation, Fuchu (JP)

( * ) Notice: Subject to any disclaimer, the term of this patent is extended or adjusted under 35 U.S.C. 154(b) by 488 days.

(21) Appl. No.: 09/013,927

(22) Filed: Jan. 27, 1998

(30) Foreign Application Priority Data

May 28, 1997 (JP) ............................................. 9-155981

(51) Int. Cl.⁷ ............................................... C23C 14/34
(52) U.S. Cl. ................................................. 204/192.12
(58) Field of Search .................................... 204/192.12

(56) References Cited

U.S. PATENT DOCUMENTS

| | | | | |
|---|---|---|---|---|
| 4,217,194 A | * | 8/1980 | Lubbers et al. | 204/192 SP |
| 4,353,788 A | * | 10/1982 | Jeffrey et al. | 204/192 S |
| 4,584,078 A | * | 4/1986 | Nakanouchi et al. | 204/192 R |
| 5,178,739 A | * | 1/1993 | Barnes et al. | 204/192.12 |
| 5,290,758 A | * | 3/1994 | Wordenweber | 505/1 |
| 5,300,189 A | * | 4/1994 | Kokaku et al. | 156/643 |
| 5,300,205 A | * | 4/1994 | Fritsche | 204/192.12 |

FOREIGN PATENT DOCUMENTS

| | | | | |
|---|---|---|---|---|
| GB | 1301653 | * | 1/1973 | C23C/15/00 |
| JP | 6-41739 | | 2/1994 | C23C/14/35 |
| WO | WO 92/07969 | | 5/1992 | C23C/14/32 |

OTHER PUBLICATIONS

Magnetron Sputter Deposition with High Levels of Metal Ionization; S.M. Rossnagel et al; Appl. Phys. Lett. 63(24), pp. 3285–3287; Dec. 13, 1993.

Advanced Metalization and Interconnect Systems for ULSI Applications; 1996; pp. 139–143.

Metal Deposition from Ionized Mangetron Sputtering Discharge; S.M. Rossnagel et al.; J. Vac.Sci. Technol. B 12(1), Jan./Feb. 1994; American Vacuum Society 1994; pp. 449–453.

* cited by examiner

*Primary Examiner*—S. H. VerSteeg
(74) *Attorney, Agent, or Firm*—Burns, Doane, Swecker & Mathis, LLP

(57) ABSTRACT

To form a film by ionized sputtering with good bottom coverage for holes with a high aspect ratio, and to simplify the structure inside and out of the sputter chamber, a target 2 is provided inside a sputter chamber 1 equipped with an exhaust system 11 and is sputtered by a sputtering power source 3. The released sputter particles are made to arrive at a substrate 50 to form a film. The sputtering power source 3 sends electric power of at least 5 W/cm² to a target 2, and the sputter particles are ionized in a plasma formed by this electric power alone. A cylindrical shield 6 may be provided between the target 2 and the substrate holder 5 to restrict the plasma formation space, and an electric field establishment means 8 may set up an electric field for extracting the ionized sputter particles from the plasma P and directing them at the substrate 50.

2 Claims, 5 Drawing Sheets

IONIZING SPUTTERING METHOD

This application claims priority under 35 U.S.C. §§ 119 and/or 365 to Japanese Application No. 9-155981 filed in Japan on May 28, 1997; the entire content of which is hereby incorporated by reference.

BACKGROUND OF THE INVENTION

1. Field of Industrial Utilization

The present invention relates to a sputtering method used in the fabrication of various types of semiconductor devices. More particularly, it relates to an ionizing sputtering method utilized in the formation of films by the ionization of sputter particles.

2. Description of Related Art

With semiconductor devices, such as various types of memory and logic devices, a sputtering process is used in the formation of various wiring films, and in the production of barrier films that prevent the interdiffusion of different layers, and sputter devices are commonly used for this purpose. There has recently been a great need for such sputtering devices to allow the inner surfaces of holes formed in a substrate to be coated with a good degree of coverage.

A CMOS-FET (field effect transistor), which is commonly used in a DRAM, employs a structure that prevents cross-contamination between the contact wiring layer and the diffusion layer by the provision of a barrier film to the inner surface of the contact holes provided on the diffusion layer. With a multilayer wiring structure for the wiring of memory cells, through holes are provided to an interlayer insulation film, and interlayer wiring is embedded inside these through holes in order to link the lower layer wiring with the upper layer wiring. Here again, a structure is adopted in which a barrier film is produced inside the through holes to prevent cross-contamination.

Because of the increasing degree of integration, the aspect ratio of these holes, i.e., the ratio of the hole depth to the size of the hole opening, has been steadily rising over the years. For example, the aspect ratio is about 4 with a 64 megabit DRAM, and is about 5 to 6 with a 256 megabit DRAM.

In the case of a barrier film, a thin film must be built up on the bottom of the hole in an amount of 10 to 15% of the amount of build-up on the peripheral surfaces of the hole. For holes with a high aspect ratio, it is difficult to form a film with a high bottom coverage, i.e., the ratio of the deposition rate on the hole bottom to the deposition rate on the peripheral surfaces of the hole. A decrease in the bottom coverage can lead to a thinner barrier film at the bottom of the hole and to critical flaws in the device characteristics, such as junction leakage.

Collimation sputtering and low-pressure, long-distance sputtering processes have been developed up to now as sputtering processes that increase the bottom coverage. Collimation sputtering involves using a plate (collimator) in which numerous holes have been made in the direction perpendicular to the substrate, and providing this plate between the target and the substrate. Collimation sputtering is a process in which only those sputter particles, usually sputter atoms, that fly more or less perpendicular to the substrate are selectively allowed to reach the substrate. Low-pressure, long-distance sputtering involves lengthening the distance between the target and substrate (usually about 3 to 5 times farther) so that relatively more of the sputter particles that fly more or less perpendicular to the substrate will land on the substrate, and lowering the pressure more than usual (about to 0.8 mTorr or less) so that the free mean path is longer, which results in less turbulence of these sputter particles.

A problem with collimation sputtering is that sputter particles accumulate on the collimator portion, and the resulting loss of material decreases the deposition rate. A problem with low-pressure, long-distance sputtering is that since the pressure is lowered and the distance between the target and the substrate is lengthened, there is a fundamental decrease in the deposition rate. Because of these problems, collimation sputtering is only used for mass-produced products of the 16-megabit class in which the aspect ratio is up to about 3, and low-pressure, long-distance sputtering is limited to devices up to an aspect ratio up to about 4.

In light of the above, an ionizing sputtering process was investigated as a technique that would allow a film to be deposited with good bottom coverage for holes whose aspect ratio is over 4. Ionizing sputtering is a process that ionizes the sputter particles released from a target, and raises bottom coverage by the action of these ions.

However, a number of practical problems are encountered with ionizing sputtering. One of these is the structure of the energy supply used for ionization.

An effective way to perform ionizing sputtering is to form a plasma along the flight path of the sputter particles from the target to the substrate. To form this plasma, an electrode in the form of a coil or a sheet is provided separately from the target, and this electrode is connected to a power source that applies electric power.

A drawback to a structure such as this, however, is the complexity of the structure inside the sputter chamber. On top of this, a power source is provided separately from the sputtering power source, so the structure around the periphery of the sputter chamber is also complicated, and the high cost is another problem.

OBJECTS AND SUMMARY

The invention of this application was conceived in an effort to solve these problems, and an object thereof is to provide a method with which a film can be deposited by ionizing sputtering with good bottom coverage for holes with a high aspect ratio.

Another object of the present invention is to provide a method with which the structure inside and outside the sputter chamber can be simplified and the cost lowered.

An ionizing sputtering method according to the present invention includes the steps of maintaining the inside of a sputter chamber at a pressure between 10 and 100 mTorr; applying electric power to a target provided inside the sputter chamber so as to create a sputter discharge and sputter said target to release sputter particles from the target, wherein the sputter particles are ionized only by the electric power applied to the target in a plasma formed by the sputter discharge; and making the sputter particles released from the target arrive at a substrate so as to build up a thin film on the surface of the substrate.

Another aspect of the the present invention includes an ionizing sputtering method comprising the steps of maintaining the inside of a sputter chamber at a pressure between 20 and 100 mTorr; applying a high frequency electric power to a target provided inside the sputter chamber so as to create a sputter discharge and sputter said target to release sputter particles from the target, wherein the sputter particles are ionized only by the high frequency electric power applied to the target in a plasma formed by the sputter discharge; and making the sputter particles released from the target arrive at a substrate so as to build up a thin film on the surface of the substrate; wherein a power area density of the high frequency electric power divided by a surface area of the target being sputtered is at least 5 W/cm².

Yet another ionizing sputtering method according to the present invention comprises the steps of applying a high frequency electric power to a target provided inside the sputter chamber so as to create a sputter discharge and sputter said target to release sputter particles from the target, wherein the sputter particles are ionized only by the high frequency electric power applied to the target in a plasma formed by the sputter discharge; and making the sputter particles released from the target arrive at a substrate so as to build up a thin film on the surface of the substrate; wherein a power area density of the high frequency electric power divided by a surface area of the target being sputtered is at least 5 W/cm².

DETAILED DESCRIPTION OF THE PREFERRED EMBODIMENTS

Figure 1:
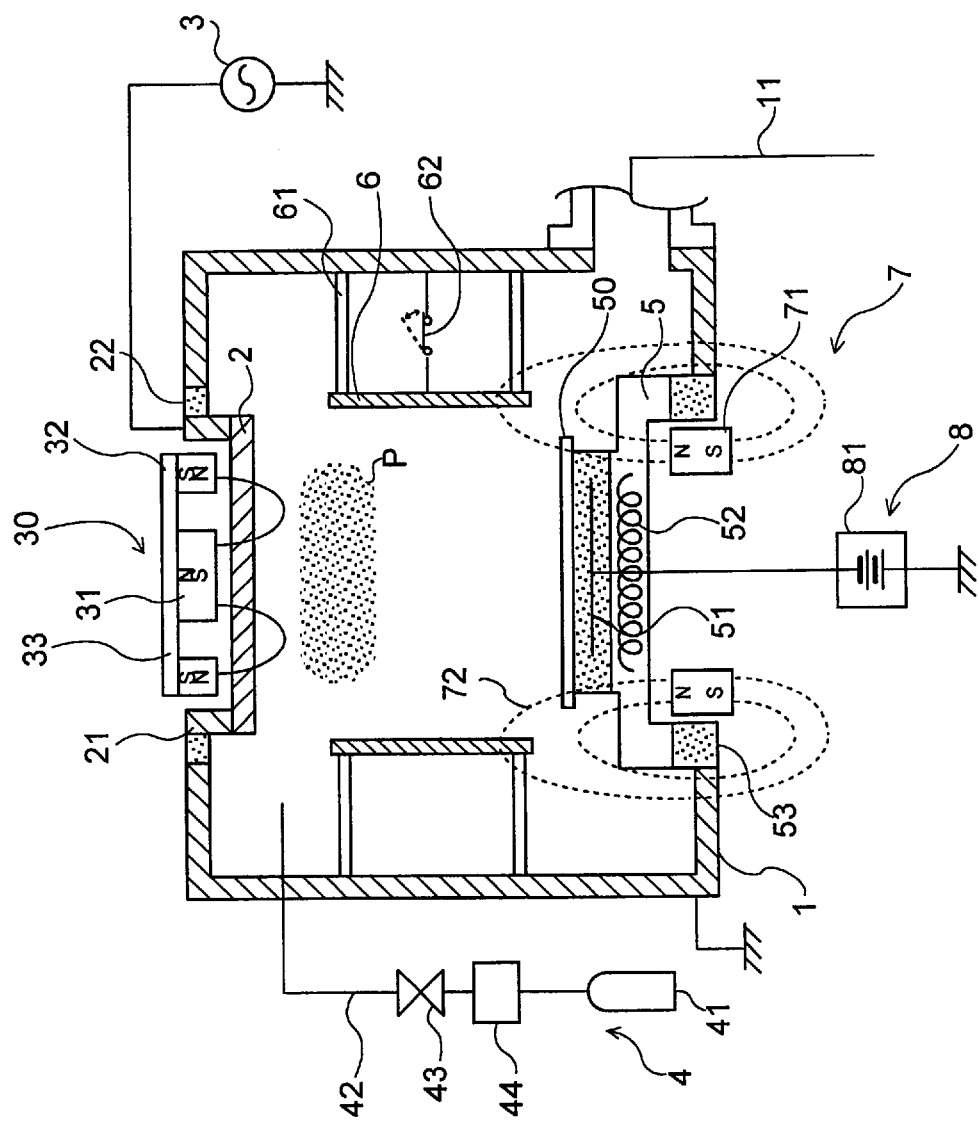
FIG. 1 is a simplified front view of the structure of the ionizing sputtering device in an embodiment of the present invention.

FIG. 1 is a simplified front view of the structure of the ionizing sputtering device used in an embodiment of the present invention. The sputter device shown in FIG. 1 has a sputter chamber 1 equipped with a vacuum pump system 11. The sputter chamber 1 has a target 2 provided on its inside, a sputtering power source 3 that sputters this target 2, and a gas introduction means 4 for introducing a gas into the sputter chamber 1. The sputter particles released from the target 2 by sputtering are directed at a substrate 50 held on a substrate holder 5.

The sputter chamber 1 is an airtight vessel equipped with a gate valve (not shown). This sputter chamber 1 is made of a metal, such as stainless steel, and is electrically grounded.

The vacuum pump system 11 is a multistage vacuum pump furnished with a turbo molecular pump and a dry pump.

The vacuum pump 11 is capable of pumping out the inside of the sputter chamber 1 down to about $10^{-9}$ Torr. The vacuum pump system 11 is equipped with a pumping speed adjuster (not shown), such as a variable orifice, which allows the pumping speed to be adjusted.

The target 2 is in the form of a disk that is 26 mm thick and about 314 mm in diameter. The target 2 is attached to the sputter chamber 1 via a metal target holder 21 and an insulator 22. The distance from the target 2 to the substrate holder 5 is about 120 mm.

A magnet assembly 30 is provided behind the target 2 so that magnetron sputtering can be performed. The magnet assembly 30 consists of a center magnet 31, a peripheral magnet 32 that surrounds this center magnet 31, and a disk-shaped yoke 33 that ties the center magnet 31 to the peripheral magnet 32. The magnets 31 and 32 are both permanent magnets, but they can instead comprise electromagnets.

This magnet assembly 30 is rotated as needed in order to even out the erosion of the target 2. The rotational axis is perpendicular to the target 2, and is slightly eccentric from the center of the target 2.

In this embodiment, the sputtering power source 3 is a high frequency power source with a frequency of 13.56 MHz and an output of 8 to 10 kW. A source with a considerably high output is used as the power source for performing high frequency sputtering. A regulator (not shown) is provided between the sputtering power source 3 and the target 2 so as to perform impedance matching.

The gas introduction means 4 primarily consists of a gas cylinder 41 filled with argon or another sputtering discharge gas, a tube 42 that links the gas cylinder 41 and the sputter chamber 1, and a valve 43 or flux adjuster 44 provided to the tube 42.

The substrate holder 5 is airtightly provided to the sputter chamber 1 via an insulator 53, and holds the substrate 50 parallel to the target 2. This substrate holder S is provided with an electric field establishment means 8 for setting up an electric field for extracting the ionized sputter particles from a plasma P formed beneath the target 2 and directing them at the substrate 50 (hereinafter referred to as an extraction-use electric field).

A substrate-biasing power source 81 that imparts a bias voltage to the substrate 50 is employed as the electric field establishment means 8 in this embodiment. A direct current power source that imparts negative, direct current voltage to the substrate 50 is used as the substrate-biasing power source 81 in this embodiment.

The substrate-biasing power source 81 doubles as a chucking power source for attracting the substrate 50 to the substrate holder 5. The upper portion of the substrate holder 5 is formed from a dielectric, and a chucking electrode 51 is embedded in the interior of this dielectric portion. Substrate-biasing power source 81 is connected to this chucking electrode 51.

The substrate-biasing power source 81 is designed to impart a direct current voltage of about −600 V to the chucking electrode 51. This voltage causes the dielectric to undergo dielectric polarization, and a negative potential appears on the surface of the substrate holder 5. An electric field is set up perpendicular to the substrate 50 by this negative potential, and the ionized sputter particles are efficiently extracted from the plasma P.

The substrate 50 is electrostatically attracted by the negative potential on the surface of the substrate holder 5. A heater 52 is provided in the interior of the substrate holder 5, and the substrate 50 is electrostatically attracted to the substrate holder 5, which enhances the precision of the temperature control by the heater 52. The heater 52 controls the temperature of the substrate 50 over a range from room temperature to about 500° C.

In addition to a negative, direct current power source, the substrate-biasing power source 81 may also be a high frequency power source. When the substrate-biasing power source 81 applies a high frequency voltage to the substrate holder 5, the charged particles in the plasma P are periodically attracted to the surface of the substrate 50. Electrons, with their higher degree of mobility, are attracted to the surface of the substrate 50 in greater number than positive ions, as a result of which the surface of the substrate 50 is in the same state as if it were biased to a negative potential. This high frequency power source can be one with a frequency of 13.56 MHz and an output of about 600 W.

A shield 6 is provided such that it surrounds the flight path of the sputter particles between the target 2 and the substrate 50. The shield 6 is cylindrical, and is provided coaxially with the target 2 and the substrate 50. The shield 6 is in the form of a cylinder with a wall thickness of about 1 mm, an inside diameter of about 300 mm, which is slightly smaller than the diameter of the target 2, and a height of about 50 mm. The distance in the axial direction from the target 2 to the shield 6 is about 20 mm. The shield 6 is formed from a nonmagnetic body, and the material from which it is made is titanium.

This shield 6 is held in the sputter chamber 1 via an insulator 61. A make-and-break short-circuiting body 62 that short-circuits the shield 6 with respect to the sputter chamber 1 is provided so as to allow selection of whether the sputter is set to grounded potential or floating potential.

With the device shown in FIG. 1, a magnetic field establishment means 7 is provided for setting up a magnetic field in order to trap the ionized sputter particles. The magnetic field establishment means 7 in this embodiment comprises a magnet 71 positioned beneath the substrate holder 5.

The magnet 71 is an annular permanent magnet positioned coaxially with the substrate holder 5, and is such that its magnetic poles are different on the inner and outer surfaces. The lines of magnetic force 72 shown in FIG. 1 are thus set up in the sputter chamber 1. It is also possible for the magnet 71 to comprise an electromagnet.

The operation of the sputtering device of this embodiment will now be described using FIG. 1.

The substrate 50 is conveyed through a gate valve (not shown) and into the sputter chamber 1, where it is placed on the substrate holder 5. The inside of the sputter chamber 1 has already been pumped down to about $10^{-9}$ Torr. After the substrate 50 is in place, the gas introduction means 4 is actuated, and a process gas such as argon is introduced at a constant flux.

The pumping speed adjuster of the exhaust system 11 is controlled so as to maintain the inside of the sputter chamber 1 at a constant pressure. The pressure here is about 20 to 100 mTorr, which is higher than the pressure in ordinary sputtering (a few mTorr). The sputtering power source 3 is actuated under this pressure, and the substrate-biasing power source 81 is also actuated at the same time.

A constant, high frequency voltage is imparted to the target 2 by the sputtering power source 3, which produces a magnetron sputter discharge. This magnetron sputter discharge forms a plasma P beneath the target 2. A substrate-biasing voltage is imparted to the substrate 50 by the substrate-biasing power source 81, as a result of which an extraction-use electric field is set up between the plasma P and the substrate 50.

The sputter particles released by sputtering from the target 2 reach the substrate 50, where they build up a thin film composed of the material of the target 2. Once the thin film reaches the desired thickness, the sputtering power source 3, the substrate-biasing power source 81, and the gas introduction system 4 are turned off. After the inside of the sputter chamber 1 has been pumped out once again, the substrate 50 is taken out of the sputter chamber 1.

When a barrier film is to be produced, a titanium target 2 is used, and argon is at first introduced as the process gas to form a titanium thin film. After this, nitrogen gas is introduced as the process gas, and a reaction between the titanium and the nitrogen is induced. The result of this reaction is a barrier film in which a titanium nitride thin film is laminated over a titanium thin film.

In the above operation, the pressure is high, i.e., about 20 to 100 mTorr, and a large amount of electric power, i.e., about 10 kw, is applied to the target 2. Under these conditions, the plasma P has high density and energy levels. The sputter particles are ionized and become ionized-sputter particles. These ionized sputter particles are efficiently extracted from the plasma P and efficiently directed to the substrate 50 by the extraction-use electric field.

These ionized sputter particles efficiently arrive at the interior of a hole formed in the surface of the substrate 50, and this contributes to the deposition of a film with good bottom coverage inside the hole. This point will be described in further detail.

Figure 2:
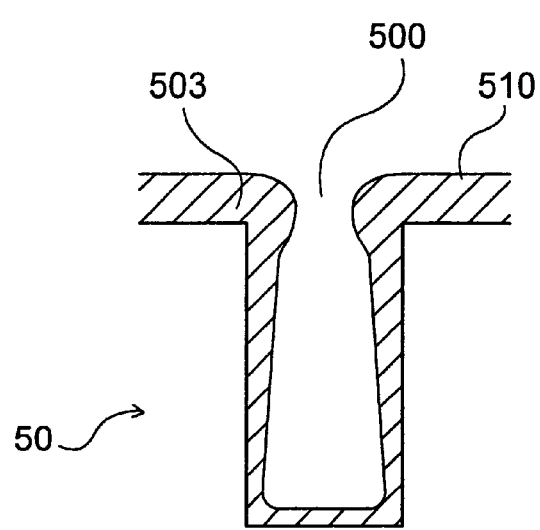
FIG. 2 is a simplified cross section of the built-up thin film, and is used to illustrate the action of the ionized sputter particles.
Figure 2:
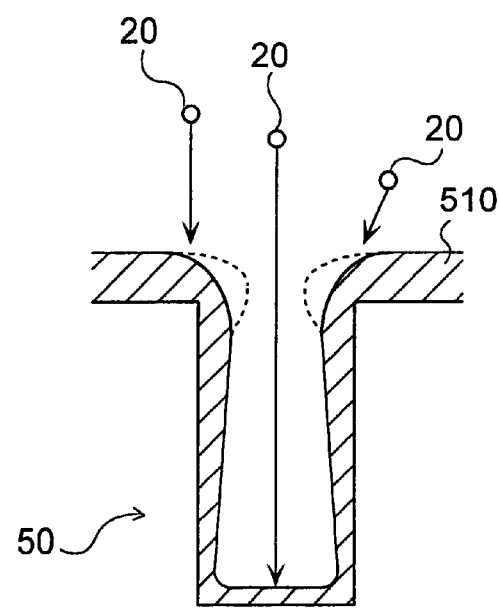

FIG. 2 is a simplified cross section of a built-up thin film, and is used to illustrate the action of the ionized sputter particles.

As shown in FIG. 2a, when a thin film 510 is formed inside a fine hole 500 formed in the surface of the substrate 50, there is a tendency for the thin film 510 to build up and create a bulge around the edge 503 of the opening of the hole 500. The thin film 510 that makes up this bulge portion is called an "overhang". The formation of this overhang raises the apparent aspect ratio through a narrowing of the opening to the hole 500. The amount of sputter atoms that reach the inside of the hole 500 decreases,.and the bottom coverage is diminished.

As shown in FIG. 2b, when the ionized sputter particles 20 reach the substrate 50, they resputter and break up the thin film 510 at the overhang portion. The ionized sputter particles 20 act so as to knock the overhang portion of the thin film 510 into the hole 500. The ionized sputter particles 20 prevent the opening to the hole 500 from narrowing, and promote film accumulation on the bottom of the hole 500, so bottom coverage is enhanced. This re-sputtering of the overhang can be produced not only by the ionized sputter particles 20, but also by the ions of process gas introduced for sputter discharge.

With the device of this embodiment, the electric field establishment means 8 sets up an extraction-use electric field that is perpendicular to the substrate 50 and that has a potential which drops toward the substrate 50. The ionized sputter particles 20 tend to be guided by this extraction-use electric field and to move perpendicularly to the substrate 50. The ionized sputter particles 20 readily reach the bottom of the deep hole 500. This also contributes to an increase in bottom coverage.

As seen in FIG. 1, the lines of magnetic force set up by the magnet 71 employed as the magnetic field establishment means 7 guide the ionized sputter particles 20 efficiently to substrate 50. This also contributes to film-depositing resulting in high bottom coverage. The lines of magnetic force 72 prevent the diffusion of the plasma P to the sides of the substrate holder 5. The lines of magnetic force 72 thus increase the plasma density and further promote ionization.

EXAMPLE 1

Sputtering can be carried out under the following conditions as a practical example (hereinafter referred to as the first practical example) of producing a titanium thin film for use as a barrier film. This example pertains to the embodiment given above.

Sputtering power source 3: 13.56 MHz, 8 kW output
Material of target 2: titanium
Type of process gas: argon
Flux of process gas: 120 cc/min
Pressure during film deposition: 60 mTorr
Substrate-biasing voltage: −600 V
Temperature of substrate holder 5 during film deposition: 300° C.
Deposition rate: 500 angstroms/min

EXAMPLE 2:

Sputtering can be carried out under the following conditions as a practical example (hereinafter referred to as the second practical example) of producing a titanium nitride thin film for use as a barrier film.

Figure 3:
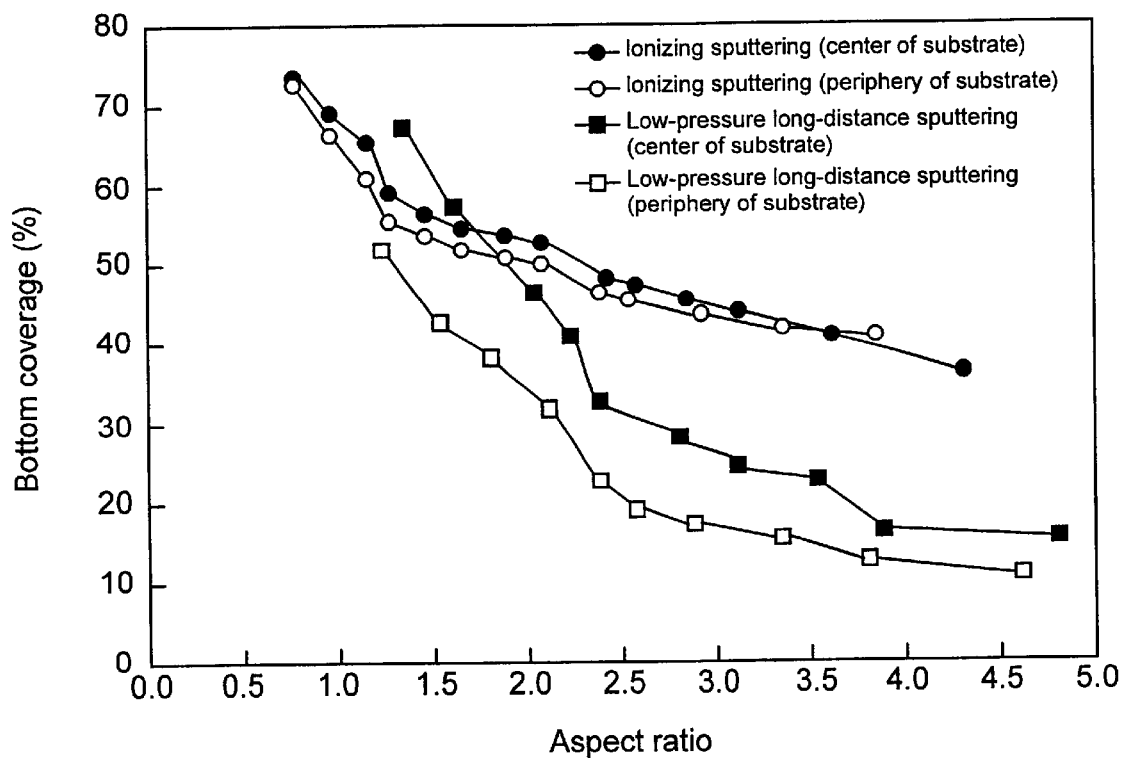
FIG. 3 is a graph of the dependence of bottom coverage on the aspect ratio of the hole, both for conventional low-pressure, long-distance sputtering and for the present

Sputtering power source 3: 13.56 MHz, 8 kW output
Material of target 2: titanium
Type of process gas: mixed gas of argon and nitrogen
Flux of process gas: argon 25 cc/min; nitrogen 75 cc/min
Pressure during film deposition: 45 mTorr
Substrate-biasing voltage: −600 V
Temperature of substrate holder 5 during film deposition: 200° C.
Deposition rate: 200 angstroms/min FIG. 3 is a graph of the results obtained by depositing a film under the conditions of the abovementioned first practical example. The graph shows the relationship of bottom coverage to the aspect ratio of the hole. For the sake of comparison, data are also shown for a conventional, low-pressure, long-distance sputter device. The data for this low-pressure, long-distance sputtering were obtained under conditions comprising a pressure of 0.5 mTorr and a distance of 340 mm from the target 2 to the substrate 50.

As shown in FIG. 3, with low-pressure, long-distance sputtering, the bottom coverage was less than 20% for a hole with an aspect ratio of 4. On the other hand, it can be seen that a much higher bottom coverage (about 40%) is obtained with the ionizing sputtering of the first practical example. A bottom coverage of approximately 35% can be obtained at the central part of substrate 50 for a hole with an aspect ratio greater than 4. It can also be seen that the present invention is effective in the deposition of films in holes such as this with a high aspect ratio. Furthermore, it can be seen that there is far less variance in the bottom coverage between the center and peripheral portions of the substrate than with low-pressure long-distance sputtering, and that there is also a great improvement in the homogeneity of the bottom coverage.

The amount of electric power sent to the target 2 is an important parameter in terms of ionizing the sputter particles in the plasma P formed by this sputtering. Sending a large amount of electric power to the target 2 is effective at promoting ionization in the plasma P. How large this amount should be for sufficient ionization will vary with the size of the space in which the plasma P is formed. If we substitute the size of the target 2 for the size of the plasma P formation space, then it can be seen that the above-mentioned ionization will generally be sufficient when the power/area density (the quotient of dividing the input power by the surface area of the side of the target 2 being sputtered) is at least 5 W/cm$^2$.

The pressure during film deposition is another important parameter in terms of the efficient ionization of the sputter particles. This is because even if the power is increased, there will be no increase in the amount of energy received unless there is an increase in the amount of gas molecules that serve as the plasma source, so the plasma density will just reach saturation.

Figure 4:
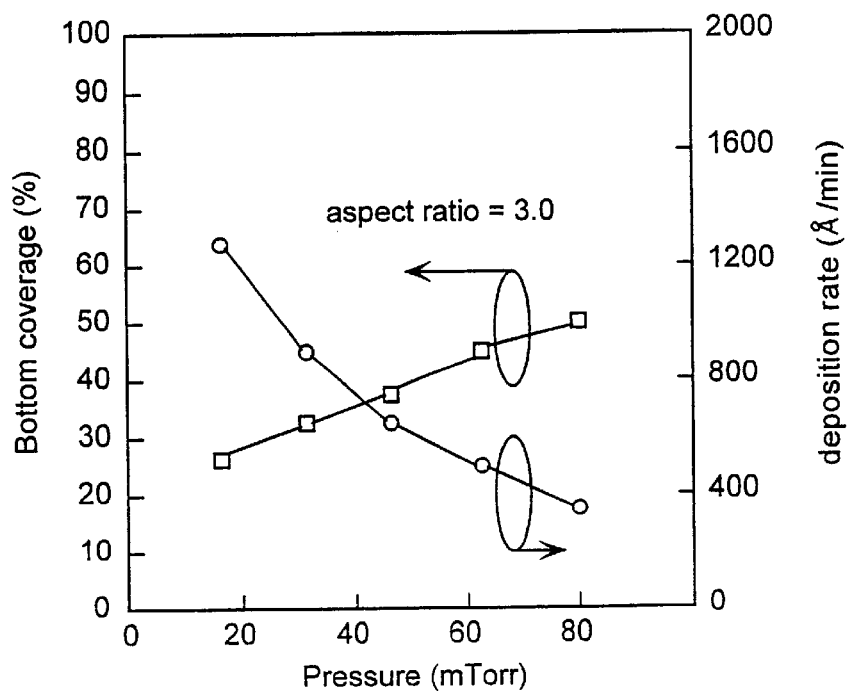
FIG. 4 shows the dependence of the bottom coverage and deposition rate on pressure of the bottom coverage and deposition rate on pressure.

FIG. 4 is a graph of the dependence on pressure of the bottom coverage and film deposition rate with respect to a hole with an aspect ratio of 3 under the conditions given in the first practical example above.

As shown by the circles in FIG. 4, there is a tendency for the deposition rate to decrease as the pressure rises. Since numerous molecules of process gas are present along the flight path of the sputter particles, many of the sputter particles are scattered, resulting in a decrease in the amount of sputter particles that arrive at the substrate 50.

As shown by the black squares in FIG. 4, the bottom coverage rises along with pressure. This indicates that the ionization of the sputter particles in the plasma P is primarily a Penning effect. The ionization efficiency of the sputter particles is seen to rise along with plasma density.

As can be seen from these data, raising the pressure is effective in terms of raising the bottom coverage. If the pressure is too high, however, there will be an undesirable decrease in the deposition rate. If the pressure is over 100 mTorr, the deposition rate may be less than 200 angstroms/min, which may pose practical problems. If the pressure is less than 20 mTorr, the action of the ionizing sputtering discussed above may not be adequately obtained. Therefore, the optimal pressure is determined after giving consideration to the required deposition rate and bottom coverage, and to the aspect ratio, and is preferably within a range of 20 to 100 mTorr.

Figure 5:
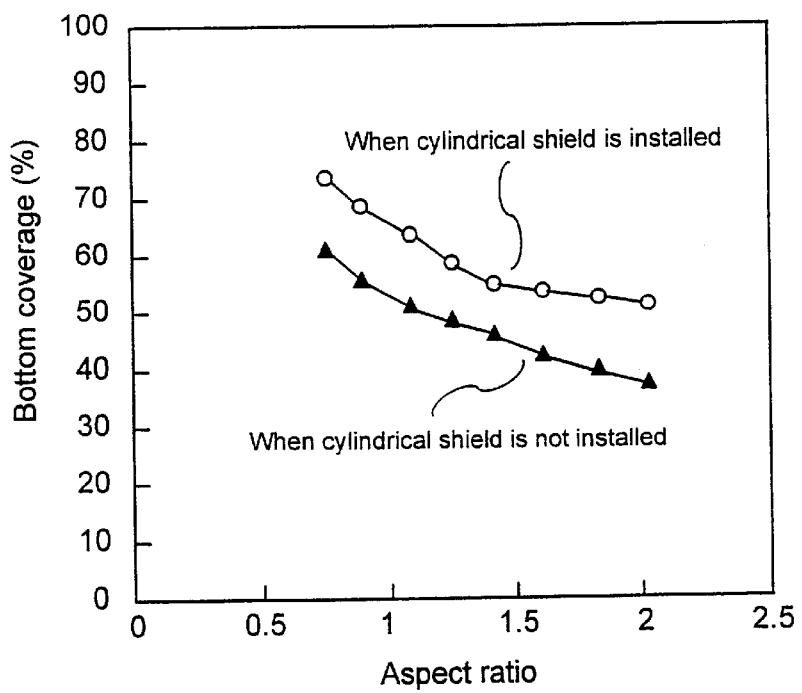
FIG. 5 is a graph illustrating the effect of a shield on bottom coverage.

FIG. 5 shows experimental results that illustrate the effect of the shield 6 on bottom coverage. In the experiment shown in FIG. 5, a film was deposited while the shield 6 was installed and removed under the conditions of the abovementioned first practical example. As shown in FIG. 5, when the shield 6 was installed, the bottom coverage was about 10 to 15% higher on average than when it was not installed.

Figure 6:
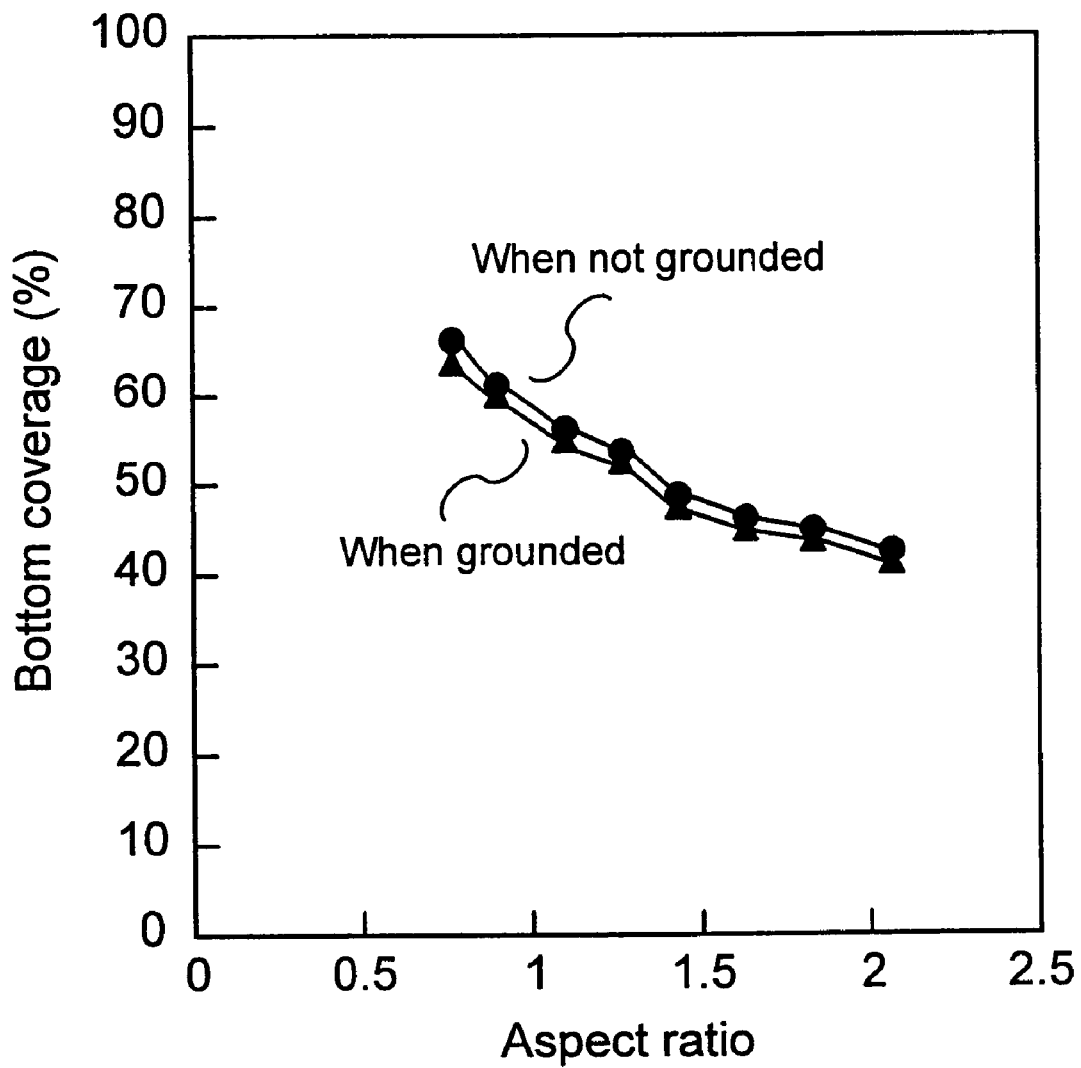
FIG. 6 is a graph illustrating the effect of the potential of the shield on bottom coverage.

FIG. 6 shows experimental results that illustrate the effect of the potential of the shield 6 on bottom coverage.

In the experiment shown in FIG. 6, bottom coverage was examined when the shield 6 was short-circuited and grounded to the sputter chamber 1 using the short-circuiting body 62, and when the short-circuiting body 62 was left open so that the shield 6 was not grounded and had floating potential.

As shown in FIG. 6, there is almost no change in the bottom coverage whether or not the shield 6 is grounded. Thus, the potential of the shield 6 has almost no effect on the ionization of the sputter particles in the plasma P.

Taking these points into account, it is believed that the increase in bottom coverage by the installation of the shield 6 as shown in FIG. 5 is not an electrical effect. The exact mechanism is unclear, but it seems that the plasma density rises because the shield 6 makes the plasma P formation space smaller, or because it prevents the diffusion of the plasma, or for some other such reason.

From the standpoint of making the space in which the plasma P is formed smaller, it is better for the shield 6 to have a smaller diameter. If it is too small, however, it will hinder the flight of the sputter particles from the target 2 to the substrate 50. The diameter of the shield 6 should be equivalent to the diameter of the target 2, and should at the least be about 90% of the diameter of the target 2.

Since no electric power is applied to the shield 6, the shield 6 is not sputtered as is the target 2. The shield 6 is not heated as is the target 2, and there is no need for a cooling mechanism or the like. A minute amount of sputtering could occur through exposure to the plasma P, so it is preferable for the surface of the shield 6 to undergo an alumite treatment to give it plasma resistance, or to make the shield 6 from a material that will not foul the substrate 50 if sputtered, e.g., the same material as the target 2.

Since there is the possibility of film build-up on the surface of the shield 6, the peeling of the built-up film is suppressed by the formation of irregularities on the surface just as with an anti-adhesion shield that prevents the sputter particles from adhering to the inner walls of the sputter chamber 1, or the film is replaceably installed and replaced after a certain number of films have been deposited.

As can be inferred from FIGS. 3 and 4, the bottom coverage is greatly improved over that obtained with a conventional device such as a low-pressure, long-distance sputter device, even when no shield 6 is installed. Advantages to a structure in which no shield 6 is installed are that the cost is lower, there is less generation of particulates, and there is no need for the troublesome work of replacing the shield 6.

In the above description of the embodiments and practical examples, the production of a titanium thin film or titanium nitride thin film for use as a barrier film was used as an example, but the present invention can similarly be applied to the production of copper films and aluminum alloy films used for wiring.

Also, the substrate 50 on which the film is formed can be any of a variety of substrates utilized in the fabrication of various semiconductor devices, as well as liquid crystal displays and various other electronic products.

As described above, with the invention of this application, sputter particles from a target are ionized, so a film can be deposited at a sufficient bottom coverage for fine holes with an aspect ratio of 4 or more. The result is an extremely effective process for the production of second generation devices making the transition from 64 to 256 megabits.

Since the energy needed for ionization can be supplied with just the electric power imparted by the sputtering power source to the target for sputtering, there is no need for the provision of a separate electrode inside the sputter chamber, or for the separate connection of a power source. The structure of the sputter chamber is simplified both inside and out, which also allows the cost to be lower.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. An ionizing sputtering method, comprising the steps of:

maintaining an inside of a sputter chamber at a pressure between 20 and 100 mTorr;

applying a high frequency electric power to a target provided inside the sputter chamber so as to create a sputter discharge and sputter said target to release sputter particles from the target, wherein the sputter particles are ionized only by the high frequency electric power applied to the target in a plasma formed by the sputter discharge; and making the sputter particles released from the target arrive at a substrate so as to build up a thin film on a surface of the substrate;

wherein a power area density of the high frequency electric power divided by a surface area of the target being sputtered is at least 5 W/cm$^2$.

2. The method of claim 1, wherein the high frequency electric power applied to the target has a frequency of 13.56 MHz.

* * * * *